(12) United States Patent
Ramirez, Jr. et al.

(10) Patent No.: US 9,638,748 B2
(45) Date of Patent: May 2, 2017

(54) TRAY LOADING SYSTEM FOR ELECTRONIC COMPONENTS

(71) Applicant: Texas Instruments Incorporated, Dallas, TX (US)

(72) Inventors: Daniel Mendoza Ramirez, Jr., Baguio (PH); Giovanni Hufana Nieva, Baguio (PH); Alvin Noel M. Macaranas, Baguio (PH); Brian Sardoma Aquino, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 477 days.

(21) Appl. No.: 14/249,526

(22) Filed: Apr. 10, 2014

(65) Prior Publication Data

US 2015/0291369 A1    Oct. 15, 2015

(51) Int. Cl.
*B07C 5/34*     (2006.01)
*G01R 31/28*    (2006.01)

(52) U.S. Cl.
CPC ........ *G01R 31/2893* (2013.01); *B07C 5/3404* (2013.01)

(58) Field of Classification Search
CPC .... B07C 1/20; B07C 5/00; B07C 5/02; B07C 5/34; B07C 5/3404; G01R 31/2851; G01R 31/2894; H01L 21/67242; H01L 21/67271; H01L 22/20

USPC .......... 206/557; 209/573; 257/E21.525; 324/757.01, 757.02, 757.03, 757.04; 414/222.02, 418

See application file for complete search history.

(56) References Cited

U.S. PATENT DOCUMENTS

| 5,313,156 A | 5/1994 | Klug et al. |
| 6,384,361 B1 | 5/2002 | Vijaykumar |
| 7,487,100 B2 * | 2/2009 | Mallett .................. B07C 7/005 206/366 |

FOREIGN PATENT DOCUMENTS

WO    2006105352 A1    6/2006

* cited by examiner

*Primary Examiner* — Michael McCullough
*Assistant Examiner* — Brendan Tighe
(74) *Attorney, Agent, or Firm* — Tuenlap D. Chan; Charles A. Brill; Frank D. Cimino

(57) ABSTRACT

A tray loading system for tested electronic components including a tray loading bin adapted to prevent trays of a first configuration from being operably received in a first bin operating mode and to operably receive trays of the first configuration in a second bin operating mode. The system also includes an operating mode switching assembly adapted to automatically change from the second operating mode to the first operating mode in response to an operation associated with removal of loaded trays of the first configuration from the tray loading bin.

8 Claims, 16 Drawing Sheets

TRAY LOADING SYSTEM FOR ELECTRONIC COMPONENTS

BACKGROUND

Modern electronic apparatus typically include multiple electronic components, such as integrated circuit dies and passive components. Such electronic components are generally manufactured at one facility and then transported to another facility where the components are tested and categorized based upon the test results. These categories are sometimes simply "good" for components that have passed the testing requirements or "bad" for those that have failed. In other cases there may be more than two categories, for example, "good1" for components meeting a first set of test standards, "good2" for components meeting a second, lesser set of test standards and "bad" for failing components Components are placed in different shipping containers, based upon their respective test categories. The loaded shipping containers are then typically returned to the manufacturer, or the manufacturer's designee, where the components are further processed. For example, good1 components may be mounted on circuit boards; good2 components may be further tested; and bad components may be discarded at the testing facility or returned to the manufacturer for analysis.

More complex electronic components, such as integrated circuit dies, are usually shipped in component trays. Most modern trays conform to industry standards for size, shape and composition. Such component shipping trays, sometimes referred to as "matrix trays," are rectangular in shape and have multiple, identical, component receiving compartments arranged in a rectangular grid. Sometimes the shape of the tray is used to identify the category of components that is contained in the tray. For this reason, many shipping trays are constructed to receive exterior inserts that may be used to selectively change the shape/footprint of the tray.

Various types of automated component testing and handling machines have been used to test components and load them into appropriate component shipping trays in a continuous process. Such systems are described, for example, in the following patents: U.S. Pat. No. 5,150,797 of Shibata, issued Sep. 29, 1992; U.S. Pat. No. 5,290,134 of Baba, issued Mar. 1, 1994; U.S. Pat. No. 5,807,066 of Smith, issued Sep. 15, 1998; U.S. Pat. No. 6,070,731 of Kobayashi et al., issued Jun. 6, 2000; and U.S. Pat. No. 6,384,361 of Vijaykumar, issued May 7, 2002, all of which are hereby incorporated by reference for all that is disclosed therein.

DETAILED DESCRIPTION

Figure 1A:
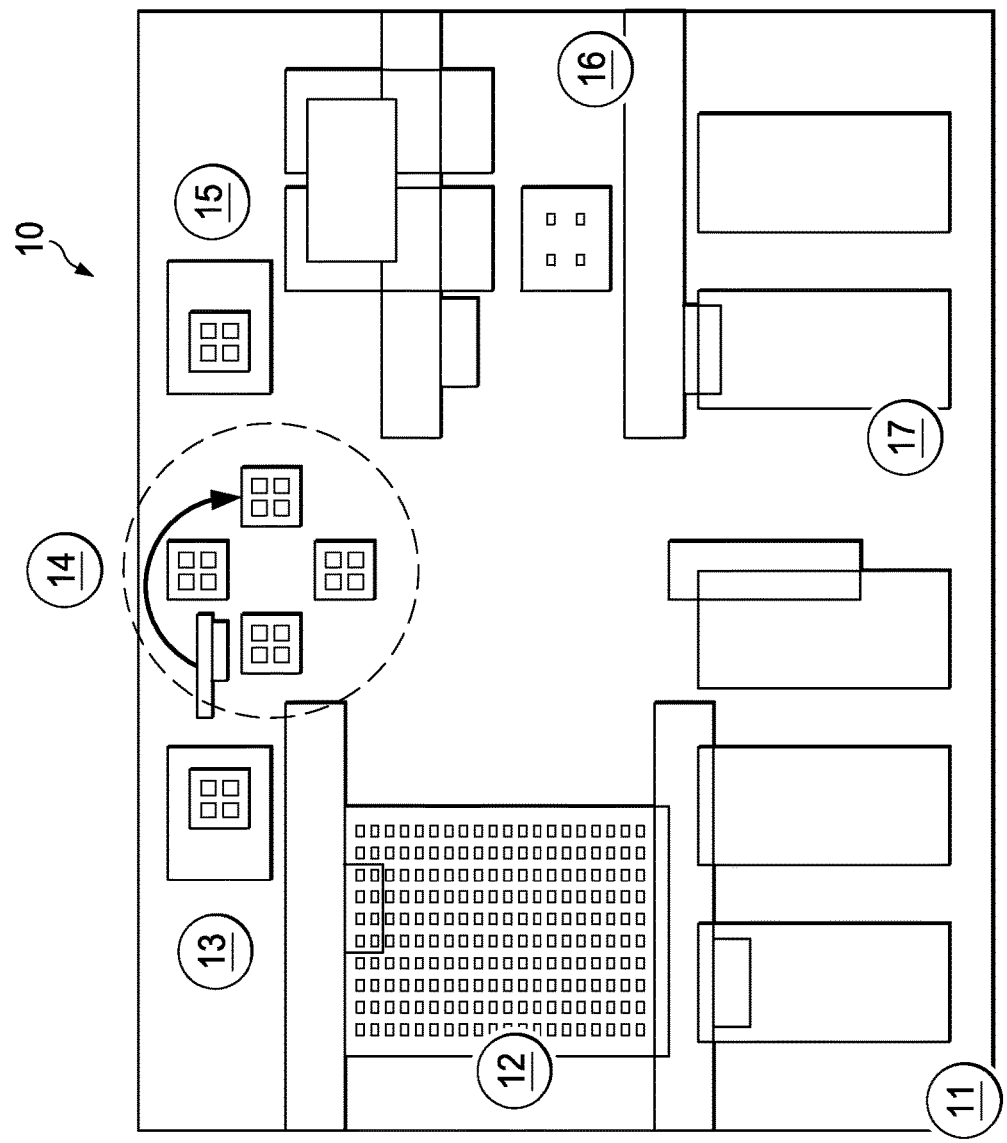
FIG. 1A is a schematic drawing of a prior art electronic component testing and handling machine.

FIG. 1A is a schematic drawing of a prior art electronic component testing and handling machine 10, known as a Yokogawa® Handler. The testing and handling machine 10 ("handler 10") has an input tray loading station 11. At station 11, input trays loaded with electronic components that are to be tested are received by the handler 10. Here the components are unloaded from the trays and moved to a preheating station 12, as by a conventional pick-and place machine. At the preheating station 12, the components are heated to a predetermined temperature. Next, at a load shuttle station 13, the preheated components are placed in a predetermined alignment for testing. Then, at a testing station 14, the components are moved to a series of test sockets where one or more functionality and continuity tests are performed on them. The various test results for each component are linked to the component and stored in a machine test results database (not shown). The components are next moved to an unload station 15 for alignment. Then, at a transfer pocket station 16, the components are precisely aligned for loading into shipping trays. Finally, at a tray loading station 17, the components are loaded, as by another pick-and-place machine, into different trays for shipping, based upon each component's individual test results.

Figure 1B:
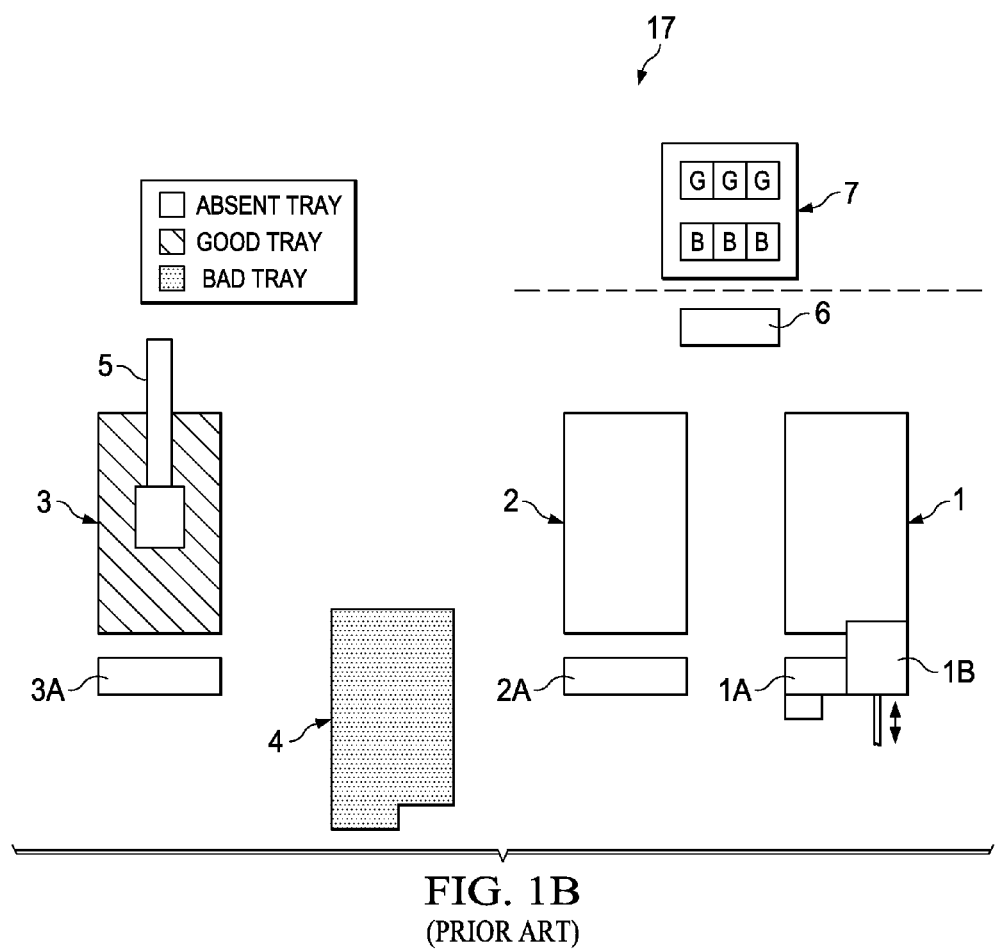
FIG. 1B is a schematic drawing of a prior art tray loading system of the testing and handling machine of FIG. 1.

FIG. 1B shows the major operating units of a prior art tray loading system 17, such as used by the Yokogawa® Handler. There are two tray bins, bin 1 and bin 2 that receive empty trays that are to be loaded with tested components. A third tray bin, bin 3, is used for storing empty good trays. Each tray bin has an automatic tray loader door 1A, 2A, 3A, respectively. The doors 1A and 2A enable a stack of filled trays to be removed from bin 1 or bin 2. For bin 3, the door 3A is used to insert a stack of empty trays. An automatic tray transfer system 5 has a tray transfer path that extends from the empty tray bin 3 to each of the other two bins 1 and 2. A pick-and-place machine 6 loads passing or good components G and failing or bad components B from a component temporary storage area 7 into trays in bins 1 and 2.

The tray loading system 17 has two different tray loading regimes and must be manually reconfigured to change from one regime to the other. In a first loading regime, good electronic components G are loaded into trays of a first configuration ("good trays") and bad components B are loaded into trays of a second configuration ("bad trays"). In a second loading regime, good components are divided into two different categories based upon their test results—"good1" or "good2" (not shown in FIG. 1B). "Good trays" having a predetermined configuration are used to receive both good1 and good 2 components. However, each individual good tray is loaded with only one type of good component. In this second loading regime bad components are not loaded into trays.

As shown by FIG. 1B, the trays, prior to being loaded with components, are moved into a tray loading bin. As previously mentioned, the system 17 has only two tray loading bins, bin 1 and bin 2 (another bin, bin 3 is used for storing empty good trays). One of the tray loading bins, bin 1, can be configured to receive either good trays or bad trays. The other tray loading bin, bin 2 is a dedicated bin that can only receive good trays.

The configurable bin 1 can be placed in the "bad tray only" receiving configuration by placing a mechanical member known as a "bin key" 1B at a predetermined position in bin 1. The bin key 1B, when in this position, physically interferes with proper seating of good trays based upon the good trays' difference in shape from bad trays. In one embodiment, the configurable bin 1 is placed in the good tray receiving configuration by physically removing the bin key 1B. The bin key 1B in one embodiment is a powered cylinder that has an extended piston position associated with the bad tray receiving configuration of bin 1 and has a retracted position piston associated with the good tray receiving configuration of bin 1.

As previously indicated, in prior art tray loading system 17 of FIG. 1B, in the first loading regime, components are classified as only "good" or "bad". The dedicated bin 2 receives only good trays and the configurable bin 1 is configured to receive only bad trays. In this first regime the bin key 1B is positioned such that it blocks good trays from being properly seated in the configurable bin 1. Empty good trays are moved into dedicated bin 2 from the empty good tray storage bin 3 by the automatic tray transfer system 5. Bad trays are loaded into bin 1 manually from a bad tray stack 4.

In the second loading regime, as previously mentioned, there are two different types of good components. Both types of good components are loaded only into good trays. All good trays have the same shape. In this second loading regime the bin key 1B is removed from the configurable bin 1, enabling bin 1 to receive good trays. Empty good trays are moved into both bins 1 and 2 from the empty good tray storage bin 3 by the automatic tray transfer system 5. Good components of the first test grade, "good1" (not shown in FIG. 1A), are loaded into good trays that are moved into the dedicated bin 2 by the automatic tray transfer system 5. Good components of the second test grade, "good 2" (not shown in FIG. 1A) are loaded into good trays that are moved into the configurable bin 1 by the automatic tray transfer system 5.

In both the first and second loading regimes, tested components are initially moved from a components temporary storage area 7 into trays located either in bin 1 or bin 2 by the pick-and-place machine 6. The pick-and-place machine 6 can, based upon the position at which a component is placed in the components temporary storage area 7, recognize good components G or bad components B, when in the first testing regime. It can recognize good1 components (not shown in FIG. 1A), and good2 components (not shown in FIG. 1A), when in the second testing regime. Depending upon the loading regime and the associated configuration of the configurable bin 1, the pick-and-place machine 6 moves a selected component to an appropriate tray in an appropriate bin 1 or 2.

A problem associated with reconfiguring the configurable bin 1 sometimes arises. The problem occurs when an operator forgets to place the bin key 1B in bin 1 when changing from the second loading regime to the first loading regime. The absence of the bin key 1B allows good trays to be loaded into the configurable bin 1 during the first loading regime, in which only bad trays should be loaded into bin 1. As a result, bad components may be loaded into good trays. If the problem is not discovered immediately, the loading integrity of an entire loading period, perhaps an entire day or more, may be called into question. Resolving the integrity of the system after such an incident may require recall and examination of the contents of many trays. It may require retesting of components loaded during that period to ensure that good trays do not contain bad components. Also, if the mistake is not caught early, the manufacturer may assemble circuit boards using bad components. Either result can be very costly to the testing organization and can significantly damage customer good will. The structure and operation of a new tray loading system 10, described below with reference to FIGS. 2-28, is designed to reduce or eliminate the occurrence of such a problem.

Figure 4:
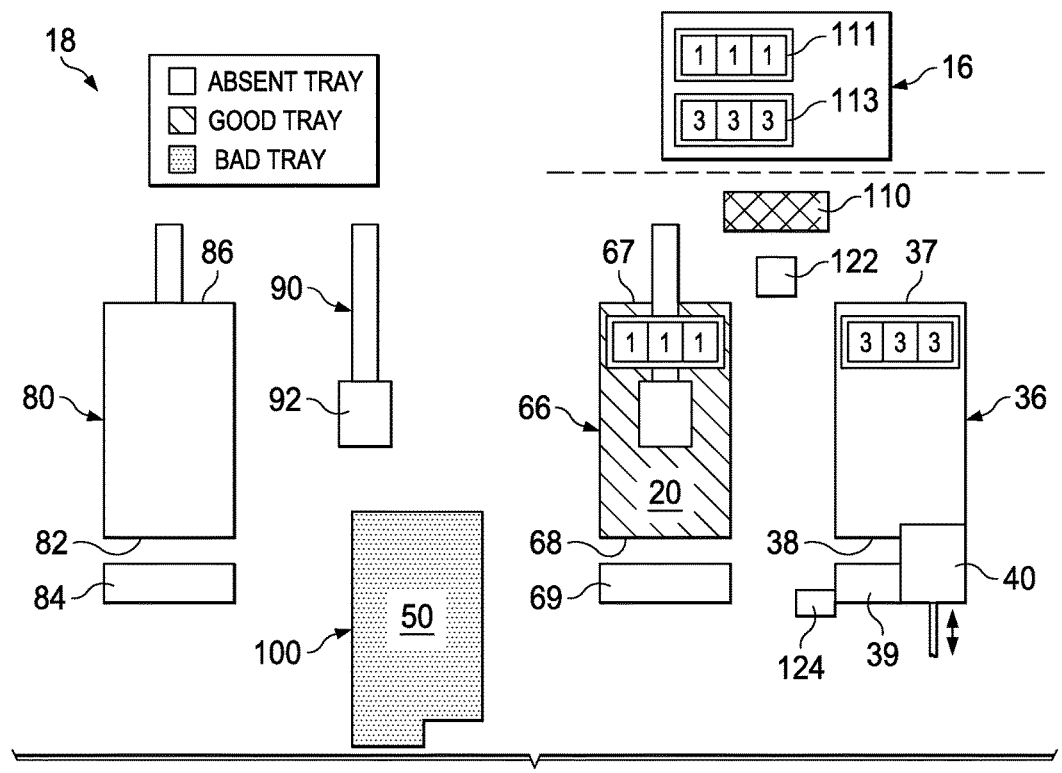
FIG. 4 is a schematic drawing of a tray loading system illustrating the major operating units thereof.
Figure 14:
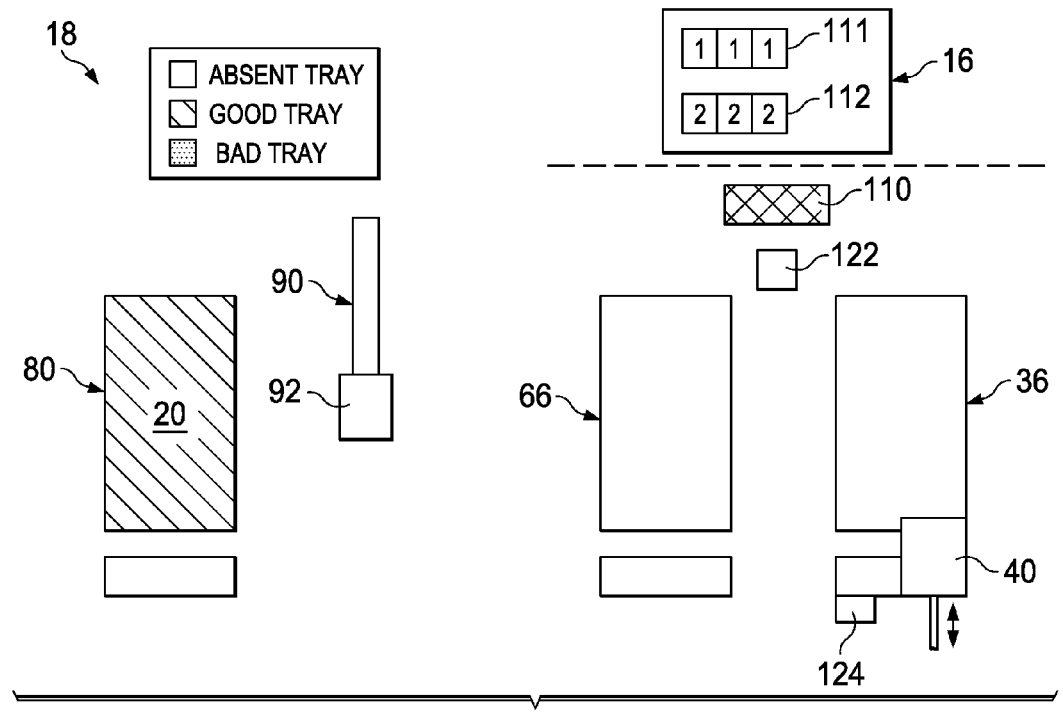
Figure 28:
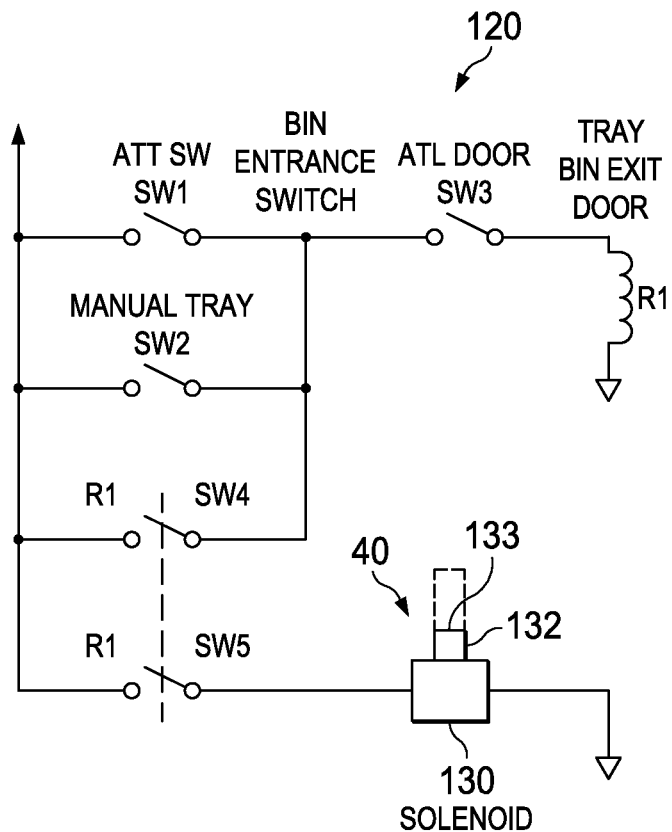
FIG. 28 is a circuit for extending and retracting a bin key cylinder.

This specification, in general, discloses a new tray loading system 18 for loading tested electronic components, including good components 111, FIG. 4, (shown in the drawings as a block containing the numeral "1"), good components of a second grade 112 (shown in the drawings as a block containing the numeral "2," e.g., FIG. 14) or bad components 113 (shown in the drawings as a block containing the numeral "3"). The tray loading system 18 includes a first tray loading bin 36, FIG. 2. The first tray loading bin 36 (also referred to as the configurable bin 36) is adapted to inoperably receive (i.e., receive in an orientation that does not permit loading of components) trays of a first configuration 20, FIG. 2, in a first operating mode. The first tray loading bin 36 is also adapted to operably receive (i.e., receive in an orientation that permits loading of components) trays of the first configuration 20, when the system 18 is in a second operating mode with a bin key 40 positioned as shown by dashed lines in FIG. 2. The tray loading system 18 includes an electrically actuatable assembly 120 such as shown in FIG. 28, which is adapted to automatically place the tray loading system 18 in either the first operating mode or the second operating mode depending on the movement of trays into and out of the configurable bin 36. Having thus described a new tray loading system 18 in general, the system 18 will be described in detail below.

Figure 2:
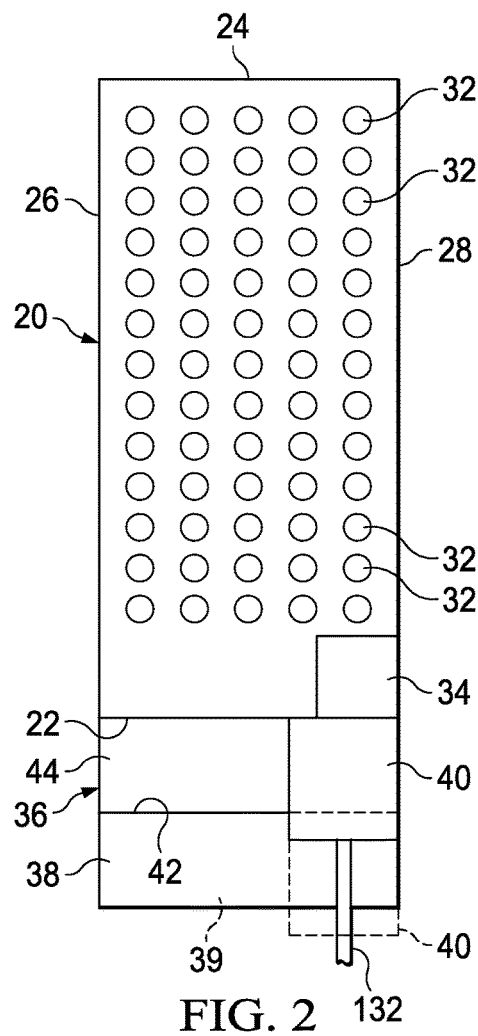
FIG. 2 is a schematic top view of an electronic component tray of a first configuration shown inoperably mounted in a tray bin.

FIG. 2 is a schematic top view of an electronic component tray 20 of a first configuration that is used to receive good components 11 or 12, FIG. 14. This tray will be referred to herein as "good tray 20" or simply "tray 20". Good tray 20 has a plurality of component receiving pockets 32, a leading edge portion 22, a trailing edge portion 24 and two lateral side edge portions 26, 28. Tray 20 may have a relatively narrow width leading edge rectangular cutout portion 34, or another external structure that distinguishes it from bad trays 50, FIG. 3.

Adjustable tray bin 36 has an entrance end portion 37, FIG. 4, through which trays enters the bin 36. It has an exit end portion 38 at which an openable and closeable bin door 39 is located. The bin door 39 may be opened manually to enable unloading of a stack of trays from the bin 36. The exit end portion 38 also supports an automatically actuatable bin key 40 thereon. Bin key 40 may comprise a powered displaceable member such as a solenoid 130, FIG. 28. The displaceable member of the solenoid 130 may have an extended position, such as shown in solid lines in FIG. 2. The tray cutout portion 34 in the good tray 20 has a relatively small lateral dimension with respect to the lateral dimension of the bin key 40. As a result, good tray 20 when urged in the direction of the bin exit end portion 38 is prevented from being properly seated in bin 36, i.e., in this embodiment, the leading edge 22 of the tray 20 is spaced apart from an engagement surface 42 of the bin 36 by a gap distance 44. With the tray 20 in this position the pick-and-place machine, or a proximity sensor, or other detector, will recognize that the tray 20 is not in a proper position for loading and will generate a signal to terminate operation of the tray loading system 18. A tray in such an unseated position is sometimes referred to herein as being "inoperably received" in the bin 36. However, if the bin key 40 is moved to its retracted position, as shown in dashed lines in FIG. 2, the tray 20 will properly seat in bin 36, which is sometimes referred to herein as being "operably received" or "operably mounted" in the bin.

Figure 3:
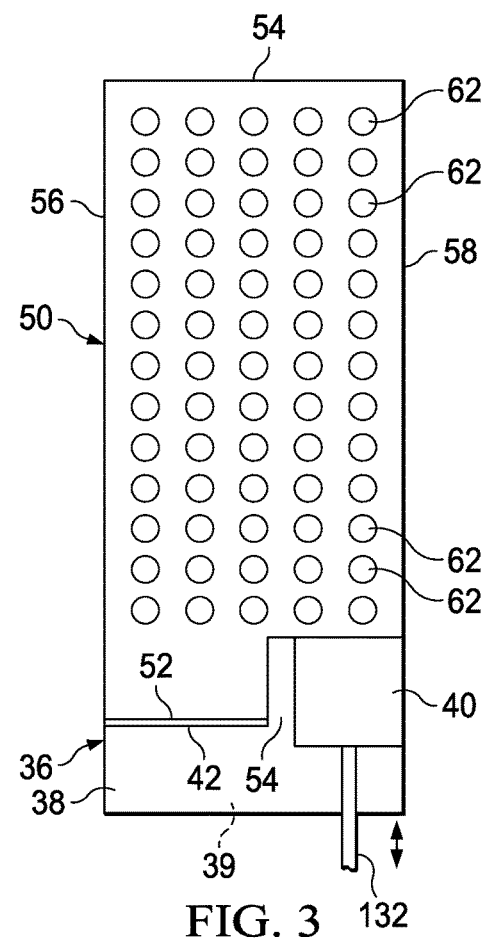
FIG. 3 is a schematic top view of an electronic component tray of a second configuration shown operably mounted in the tray bin of FIG. 2.

FIG. 3 is a schematic top view of an electronic component tray 50 of a second configuration that is operably mountable in the configurable tray bin 36. In the illustrated embodiment the component tray 50 is adapted for receiving bad components and is sometimes referred to herein as a "bad tray." Tray 50 has a leading edge 52, a trailing edge 54 and first and second lateral edges 56, 58. It contains a plurality of electronic component receiving pockets 62 and has a cutout 54 with a lateral dimension that is larger than the lateral dimension of the solenoid displaceable portion 34 of the bin key 40. Because of this relatively large dimension cutout 54 and the alignment of the cutout 54 with the bin key 40, bad tray 50 may be operably received in tray bin 36 with its leading edge 52 positioned in engagement with the engagement surface 42 of tray bin 36, whether the bin key 40 is in the extended position shown in FIG. 3 or in the retracted position shown in dashed lines in FIG. 2. When tray 50 is thus operably received in the adjustable tray bin 36, system operations will not be terminated and operation in the first operating mode may continue.

In summary, when the solenoid portion of the bin key 40 is in the extended position illustrated in solid lines in FIG. 2 and in FIG. 3, bin 36 will not properly receive good trays 20, but it will properly receive bad trays 50. When the bin key 40 is in the retracted position shown in dashed lines in FIG. 2, bin 36 will properly receive both good trays 20 and bad trays 50. However, since bad trays 50 are loaded only manually by an operator, there is not a problem with bad trays 50 being loaded into the adjustable first bin 36 when the system is in the second operating mode.

FIG. 4 is a schematic drawing of a new tray loading system 18 illustrating the major operating units thereof. The tray loading system 18 has a configurable/adjustable bin 36, with an automatically actuated bin key 40, as previously described with reference to FIGS. 2 and 3. The system 18 includes a dedicated bin 66 (sometimes referred to herein as second bin 66) that is adapted to receive only good trays 20 in both operating modes. The dedicated bin 66, like the configurable bin 36, has a tray entrance portion 67 and a tray exit portion 68 with an unloading door 69.

The tray loading system 18, has a storage bin 80 for holding a supply of empty good trays 20. The storage bin has an entrance portion 82 with a door 84 that may be opened to insert good trays 20. The storage bin 80 has a tray exit portion 86 through which empty trays leave the storage bin. Trays are moved out of the storage bin 80 and transferred to the other two bins 36, 66 by an automated tray transfer system 90 with a displaceable carriage or head 92, which may be of a type known in the art, such as for example those disclosed in the above patents incorporated by reference herein. Bad trays 50 may be stored in a stack 100 from which they are manually loaded into the configurable bin 36 when the tray loading system 18 is in the first operating mode.

Tested components, e.g. 111 and 113, that are to be loaded are located at known positions in a temporary storage unit 16, sometimes referred to in the art as a "transfer pocket," The type of component (good1 111, good2 112, FIG. 14, or bad 113) that is located at each position in the storage unit 16 is stored in machine memory. This information is conventionally used by a pick-and-place machine 110 to determine the tray loading bin 36 or 66 to which each component will be moved.

A bin key actuation circuit assembly 120, FIG. 28, includes a first switch SW1 located along a path of the automatic tray transfer system ("ATT") 90, which is triggered when a tray is moved along the path into the adjustable first bin 36 by the tray transfer system 90. The bin key actuation circuit assembly 120 also includes a manual tray switch SW2 that may be selectively switched by an operator. A third switch SW3 is switched by opening a tray unloading door 39 of the adjustable tray bin 36. A relay R1 is provided that switches both a forth switch SW4 and a fifth switch SW5 when current flows through it. In certain switched states of the bin key actuation circuit assembly 120, it automatically terminates current to a solenoid 130 thereby causing extension of a piston arm 132, as shown in dashed lines in FIG. 28. The piston arm 132 may be connected to the bin key 40 as shown in FIGS. 2 and 3. Placing the piston arm 132 in the extended position initiates the system's first (good/bad) operating mode. The circuit automatically provides current to the solenoid 130 to place the piston arm 132 thereof in the retracted position, shown in solid lines in FIG. 28, to initiate the bin's second (good1/good2) operating mode. In some embodiments the solenoid 130 and its piston arm 132 are components of the bin key 40. The terminal end 133 of the piston 132 engages good trays 20 preventing operable mounting thereof when the piston arm 132 is extended. An operating sequence of the bin key circuit 120 is described in further detail below.

Operations of the tray loading system 18, starting with operations of the loading system 18 in the first loading regime in FIGS. 5-13, and ending with the system in the second loading regime in FIGS. 14-27 will now be described. In this new tray loading system 18, a solenoid piston arm 132 portion of the bin key 40 is moved to different locations to change between the two operating modes of the adjustable bin 36. The bin 36 is in the first operating mode during the portion of the first loading regime when bad trays 50 are seated in the bin 36 and loaded. The bin 36 is in the second operating mode during the portion of the second loading regime when good trays 20 are seated in bin 36 and loaded. However, the adjustable bin 36 is not in the second operating mode during the entire second regime. In other words, there are times when the adjustable bin 36 is in the first operating mode during the second loading regime.

A typical operating sequence will now be described with reference to FIGS. 5-28. FIGS. 5-13 show the system 18 in the first loading regime during which good trays 20 are loaded with good components 111 and bad trays 50 are loaded with bad components 113. FIGS. 14-27 show the system 18 in the second loading regime during which good1 component 111 and good2 components 112 are segregated by loading each type into a different good tray 20. The adjustable bin 36 is in the first operating mode (with the bin key 40 preventing proper seating of the good trays 20) in FIGS. 4-21 and in the second operating mode (with the bin key 40 retracted) in FIGS. 21-26, returning to the first operating mode in FIG. 27.

Figure 5:
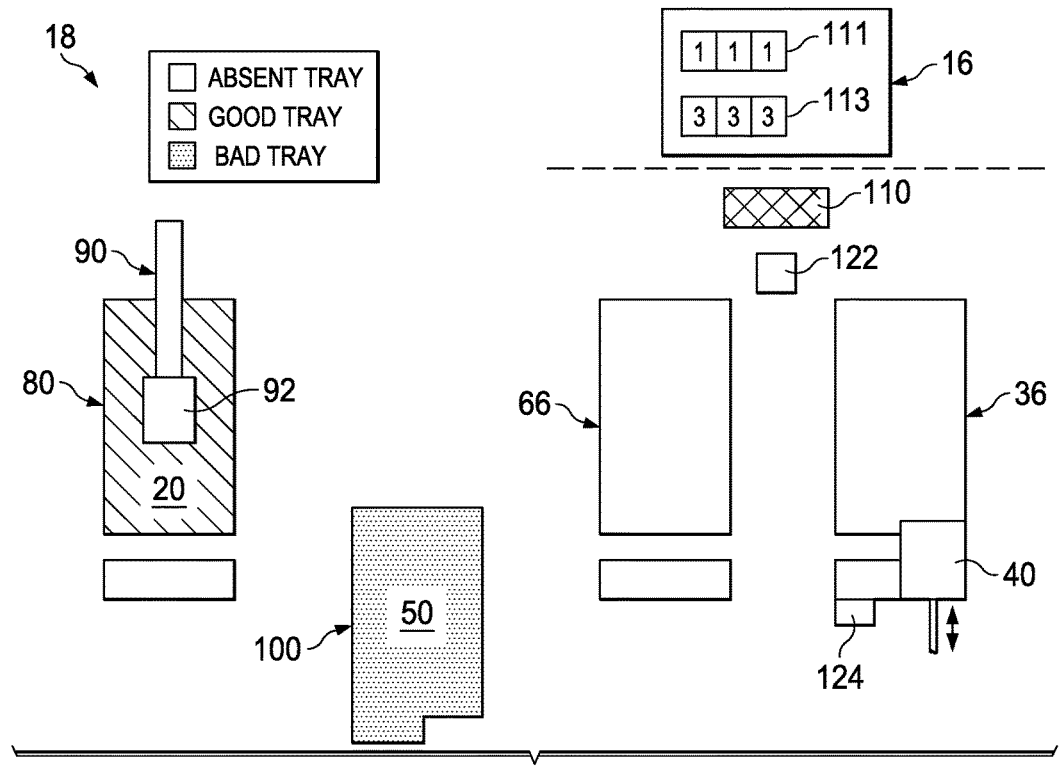
FIGS. 5-27 are schematic drawing of the tray loading system of FIG. 4 illustrating a series of operations that may be performed by the tray loading system.
Figure 6:
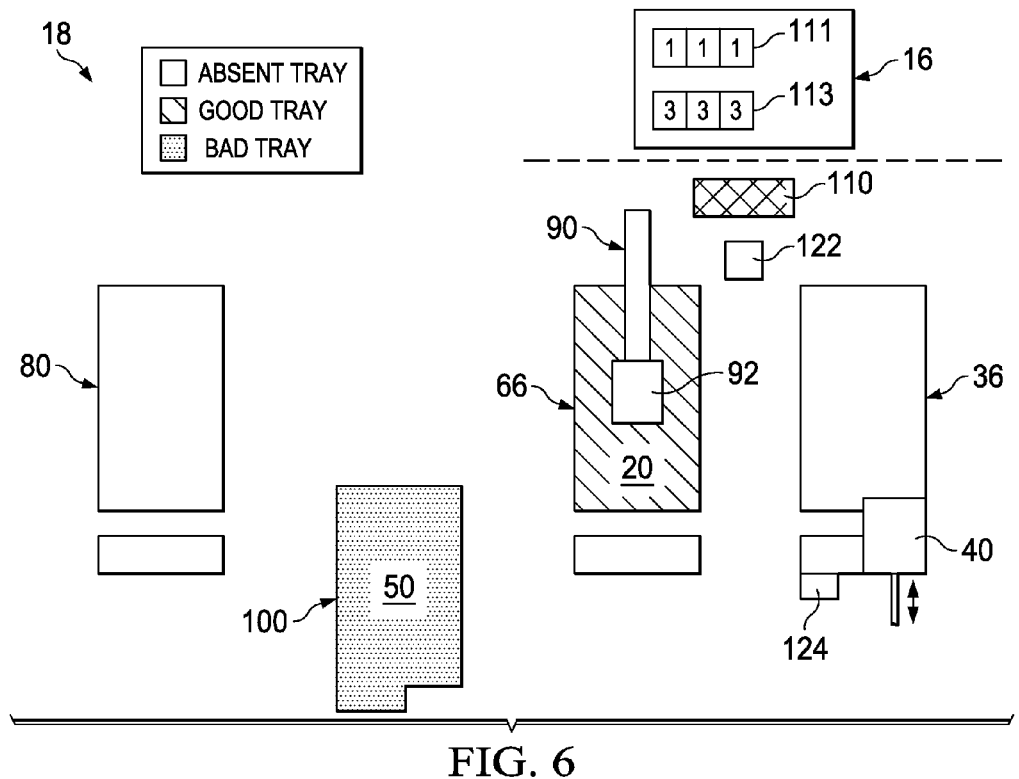
Figure 7:
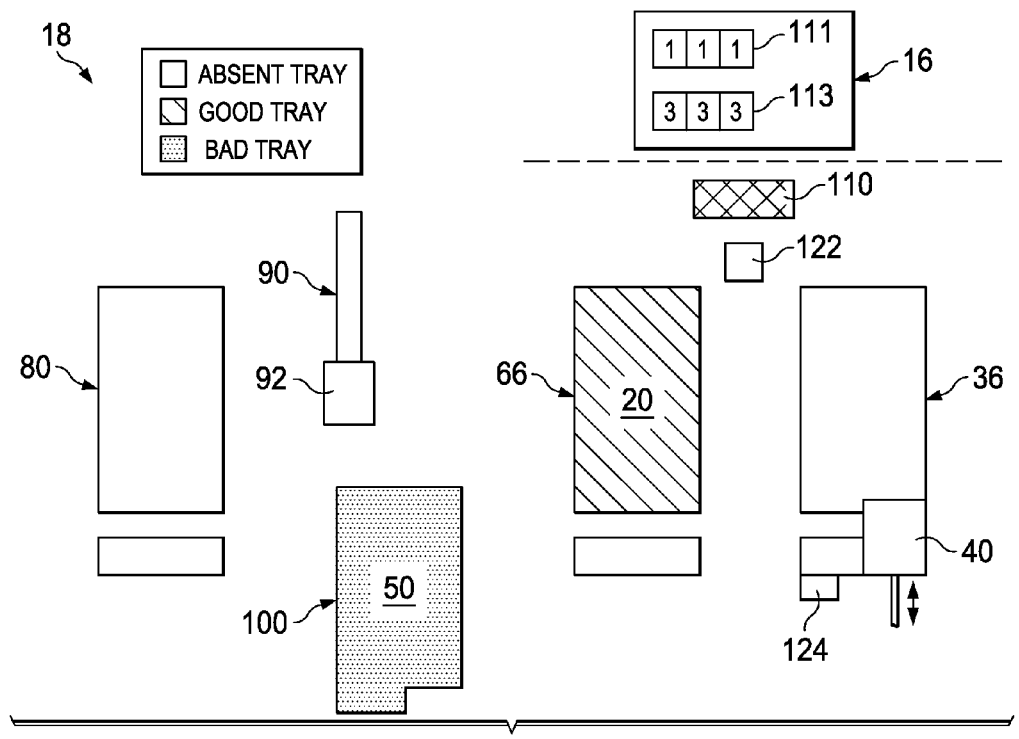

FIG. 5 is a schematic drawing of the tray loading system of FIG. 4 illustrating an operating sequence in the first operating mode, during which the carriage 92 of the automatic tray transfer system 90 is moved to the empty tray storage bin 80 to engage a good tray 20 stored therein. Next, as shown in FIG. 6, the carriage 92 moves the engaged good tray 20 to the dedicated good tray bin 66. Then the conveyance carriage 92 returns to its home position, as shown in FIG. 7.

Figure 8:
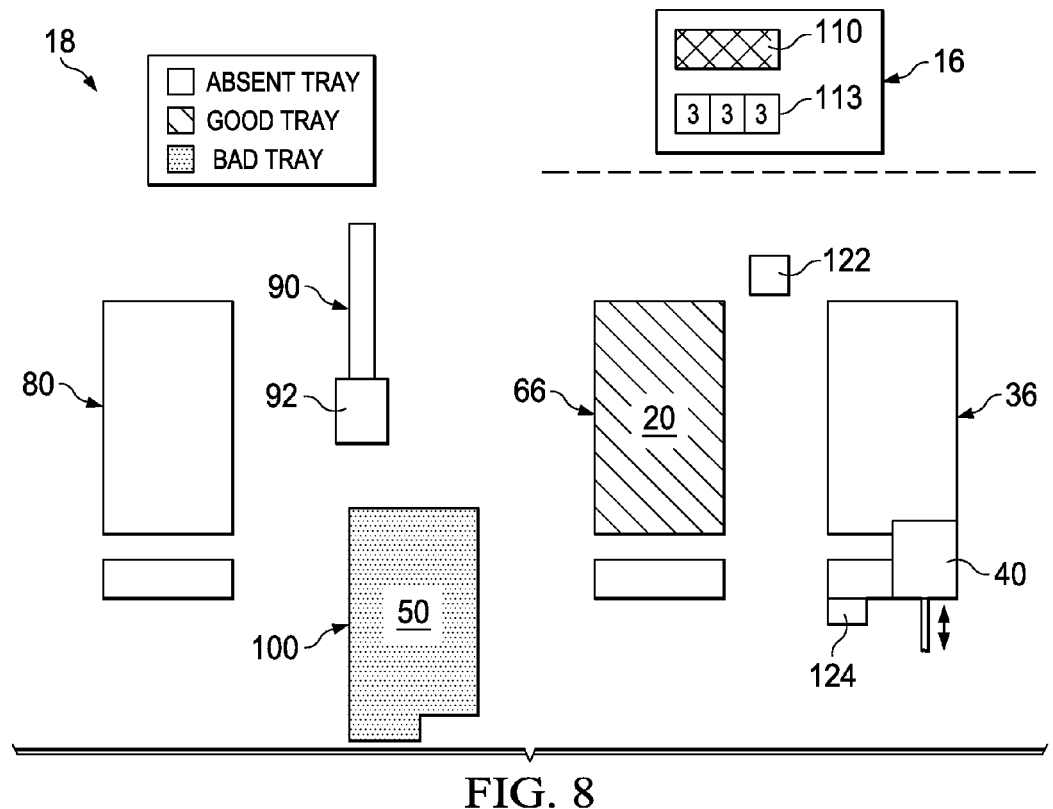
Figure 9:
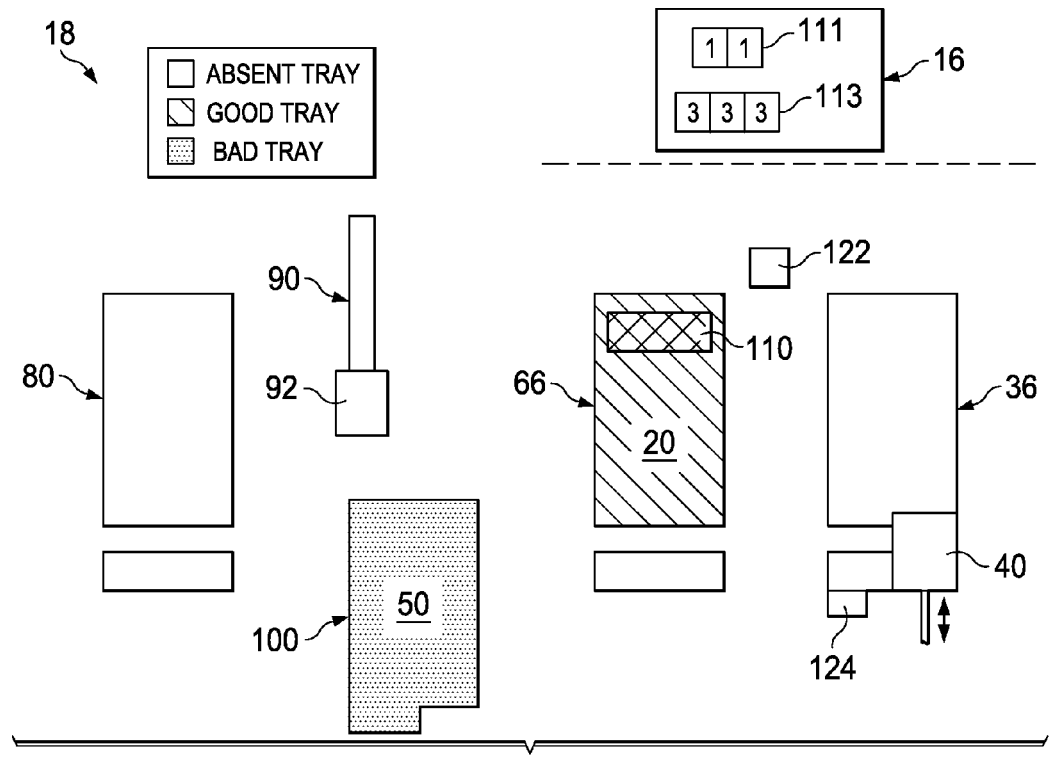
Figure 10:
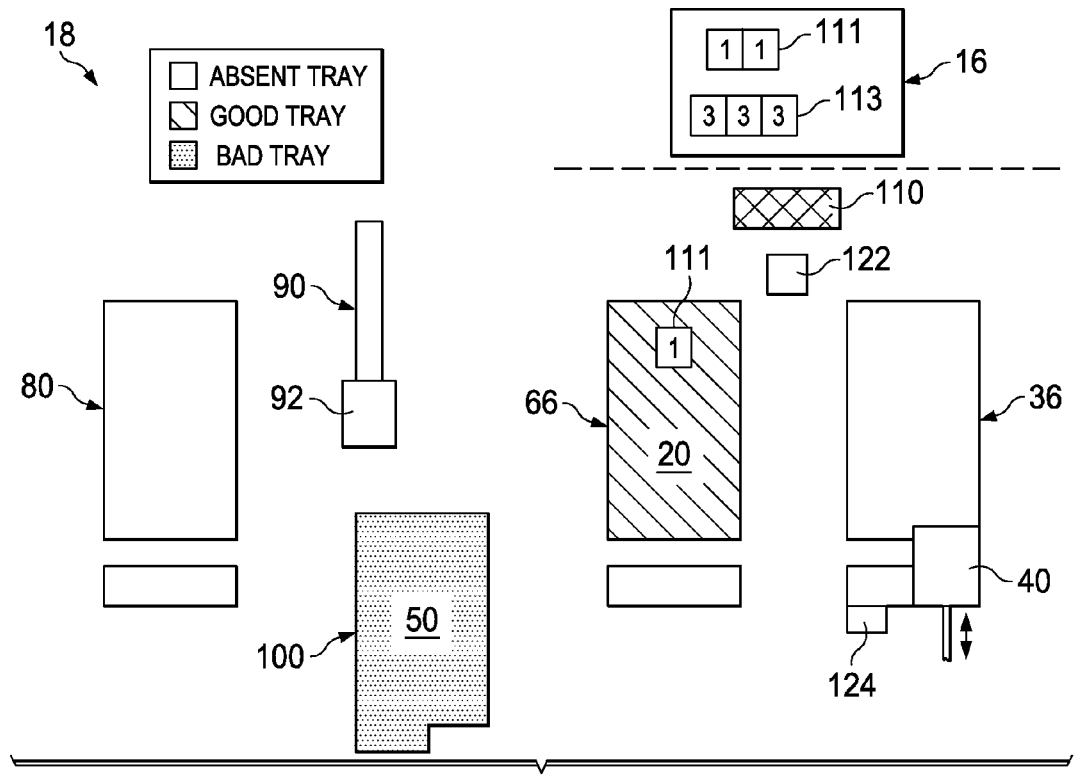

FIG. 8 shows the next operating sequence in which the head of the pick-and-place machine 110 moves to the component temporary storage platform 16 to engage a good component 112, which is shown covered by the head of the pick-and-place machine 110 in FIG. 8. Then, as shown by FIG. 9, the head of the pick-and-place machine 110 moves to the dedicated good components bin 66 to deposit a good component 112 [now shown] in a good tray 20 therein. The sequence shown in FIGS. 8-10 is repeated until all of the good components on the temporary storage platform 16 have been moved to the good tray(s) 20 in bin 36.

Figure 11:
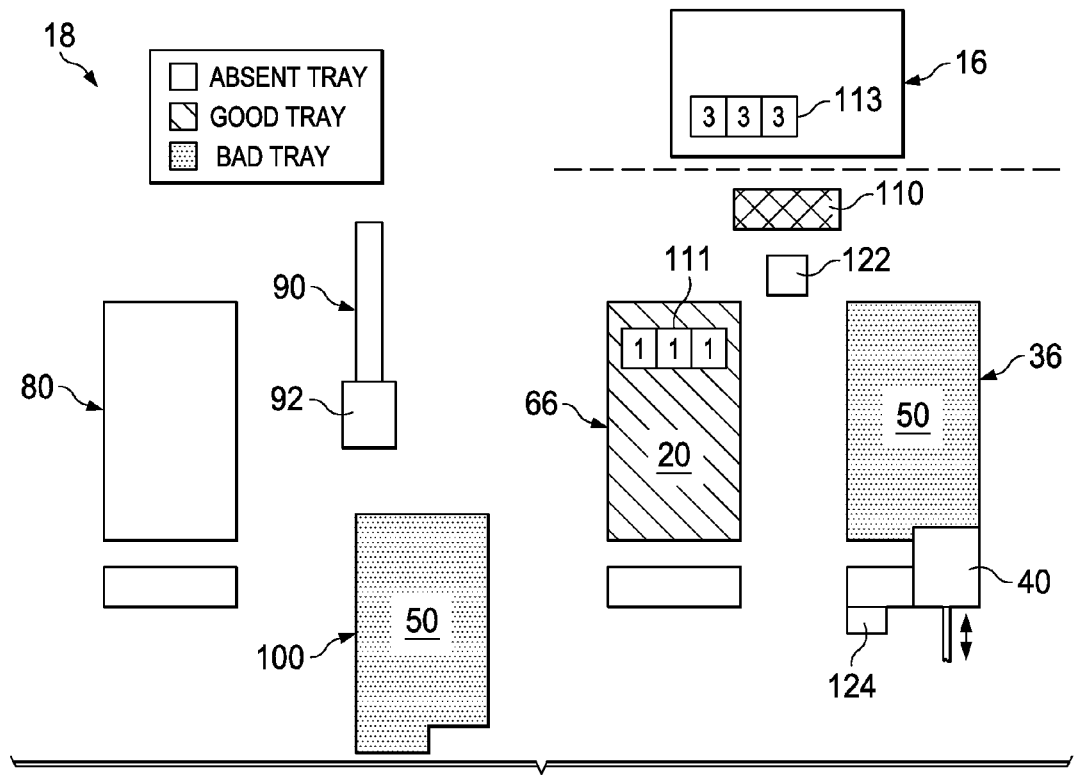
Figure 12:
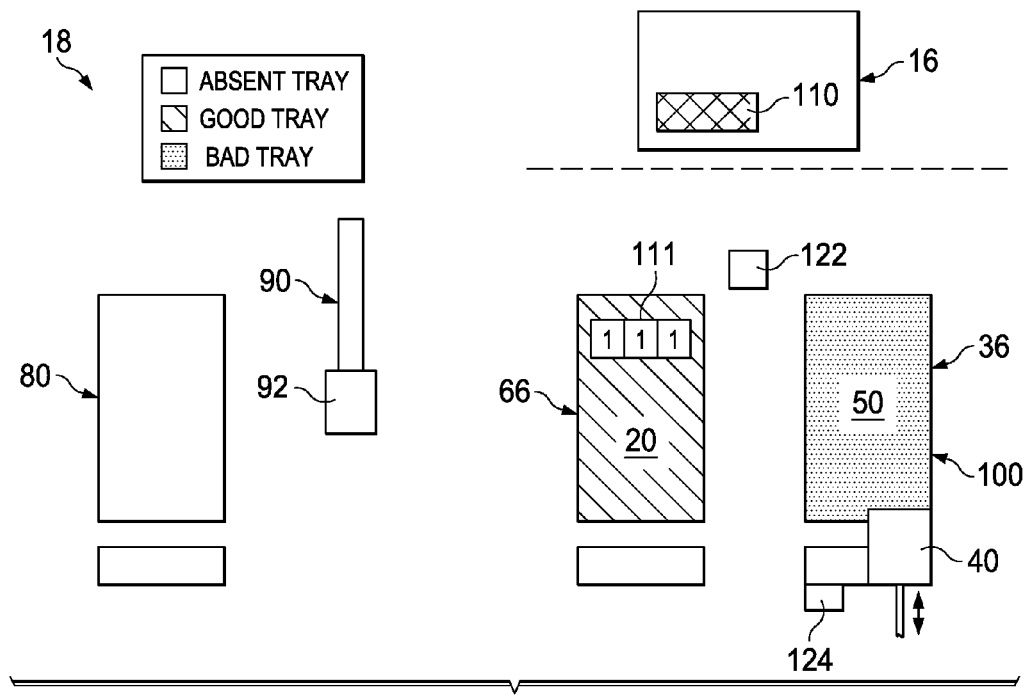
Figure 13:
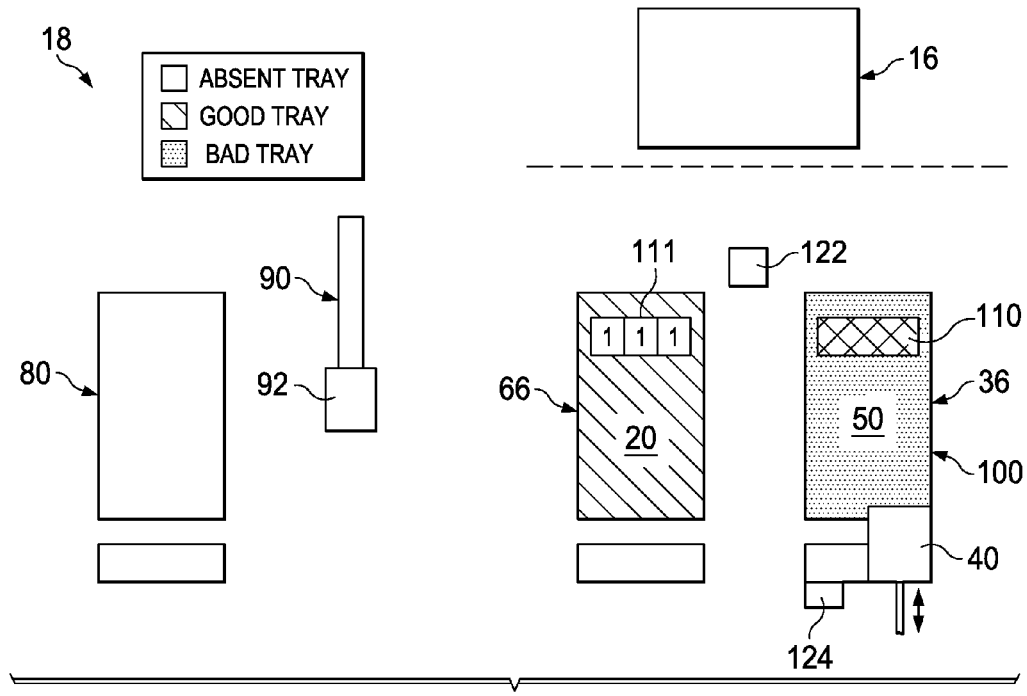

FIG. 11 illustrates the next operating sequence taking place in the first operating mode. In this sequence a bad tray 50 has been moved manually from a bad tray stack 100 and placed in the configurable tray bin 36. The configurable tray bin 36 is configured to operably receive bad trays 50 and to prevent good trays 20 from being operably received therein. Thus, the bin key 40 is in the extended position. Next, as shown in FIG. 12, the head of the pick-and-place machine 110 moves to the component temporary storage platform 16 to engage a bad component 114, which is covered by the head of the pick-and-place machine 110 and thus not visible in FIG. 112. Then, as shown in FIG. 13, the head of the pick-and-place machine 110 moves to the configurable tray bin 36 to deposit the bad component 114 in the bad tray 50 therein. The operations of FIGS. 12 and 13 are repeated until all of the bad components have been loaded into tray(s) 50. Then the pick-and-place head 110 returns to its home position as previously shown in FIG. 10.

FIG. 14 is a schematic drawing of major operating units of the tray loading system 18 at a time that the system 18 is to operate in the second loading regime. The adjustable/configurable bin 36 is still in the first operating mode with the bin key 40 in the extended position. The system 18 is operating in the second loading regime because the temporary storage platform 16 now contains only good components (good1 111 and good2 112) that are to be segregated during loading into different good trays 36, i.e., each good tray that is loaded contains only good1 components 111 or only good2 components 112.

Figure 15:
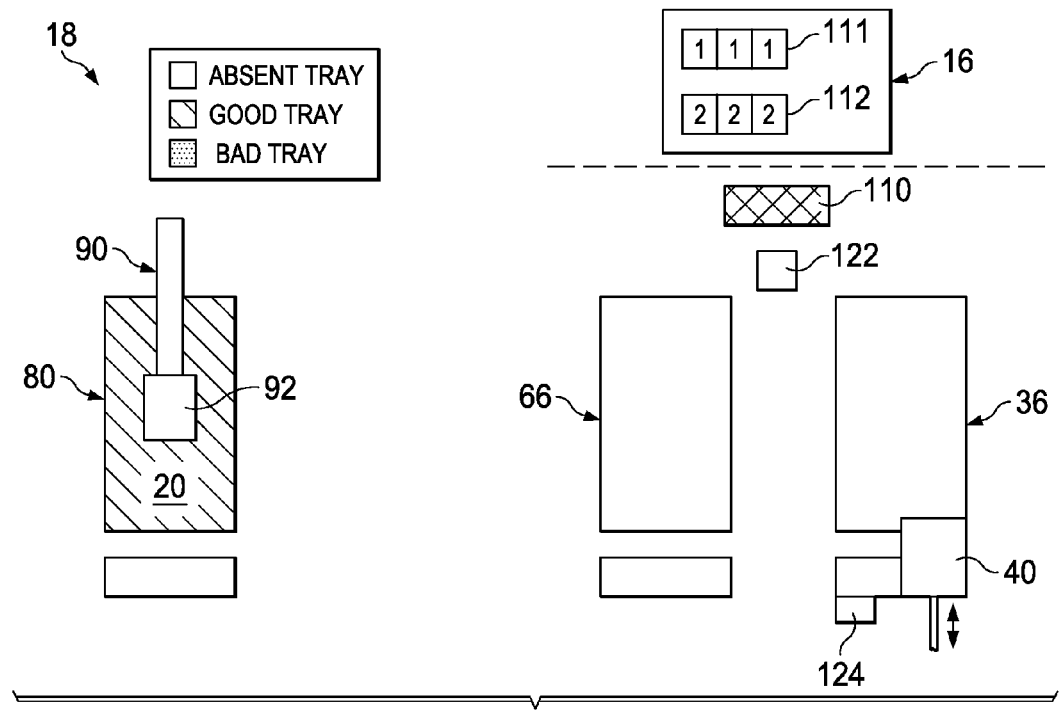
Figure 16:
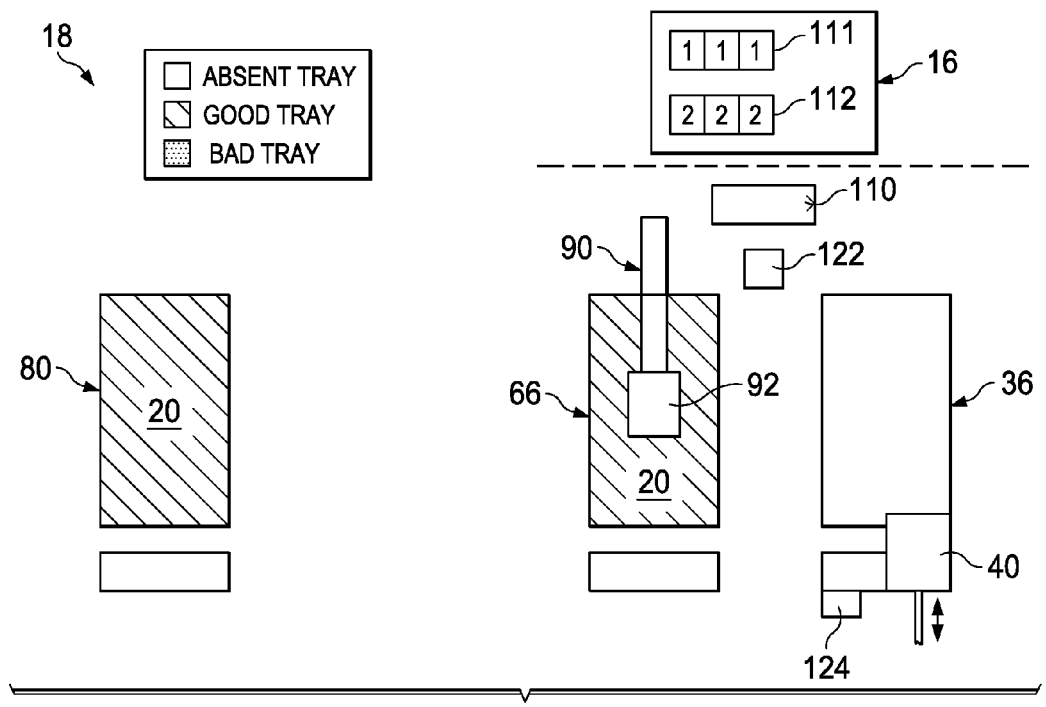
Figure 17:
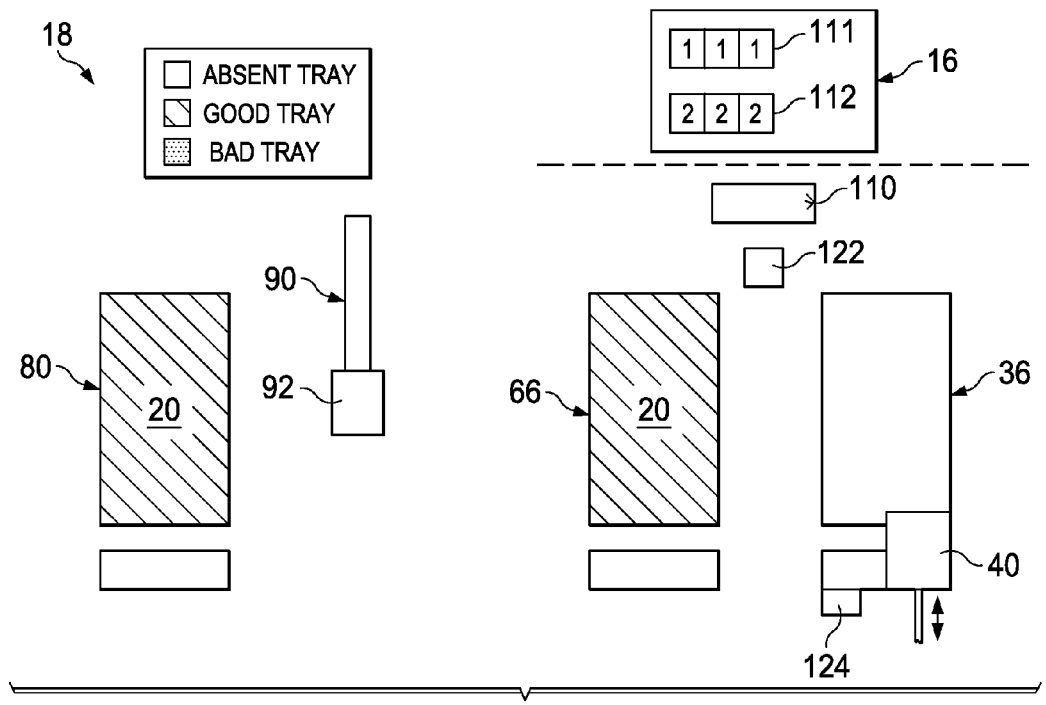
Figure 18:
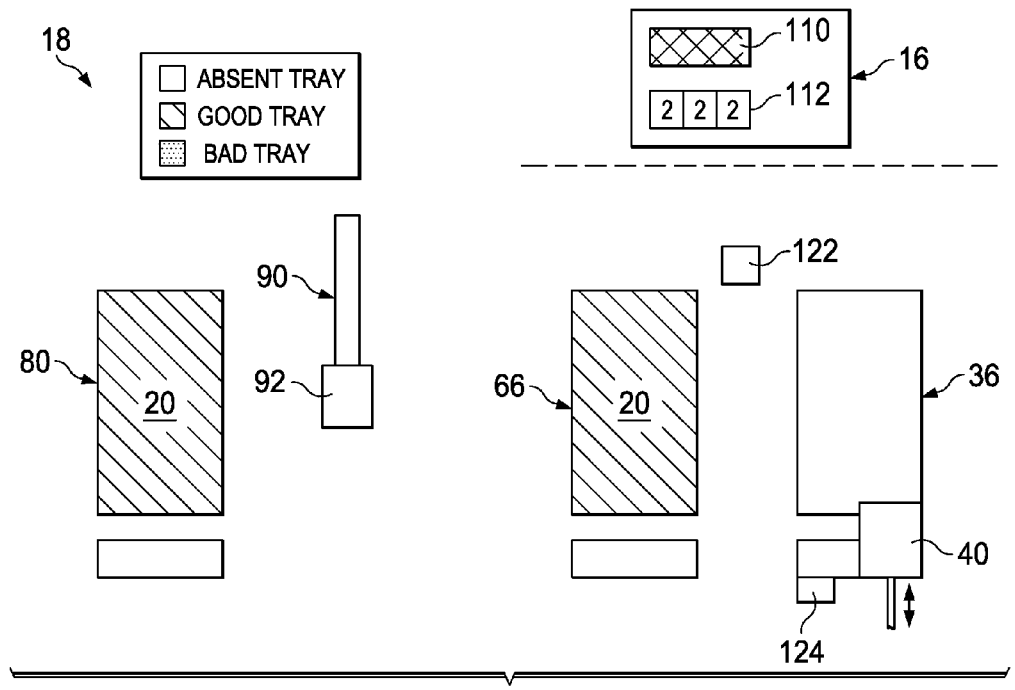
Figure 19:
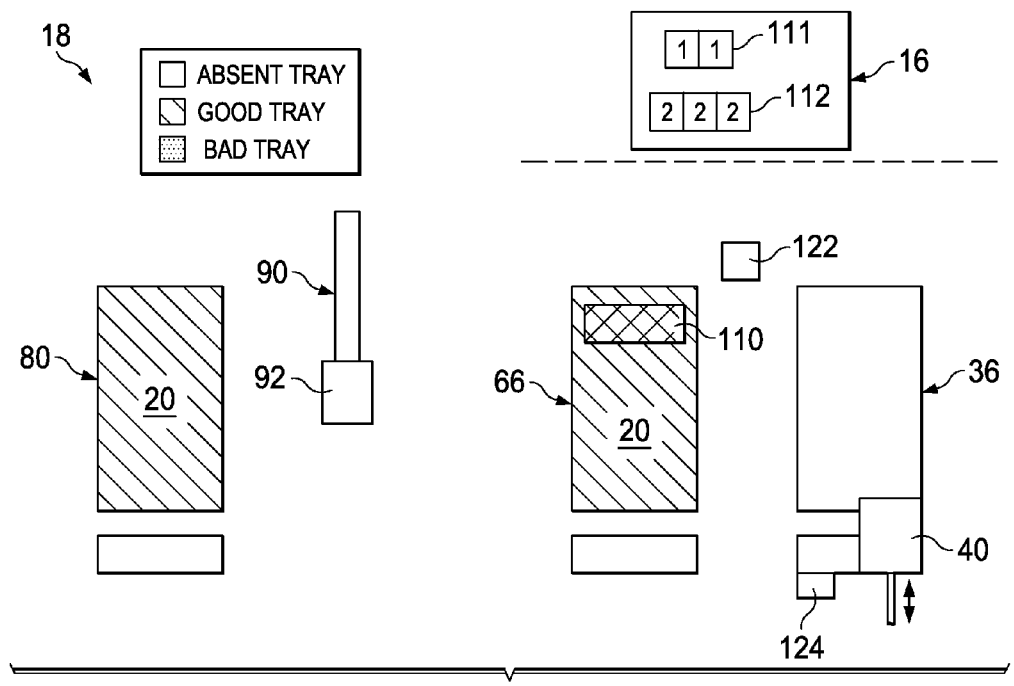

Initially, as shown in FIG. 15, the tray transfer system carriage 92 moves to the tray storage bin 80 and engages a good tray 36. FIG. 16 illustrates the next operation where the carriage 92 transfers the good tray 20 to the dedicated storage bin 66. Then, as shown in FIG. 17, the carriage 92 returns to its home position. Next, as shown by FIG. 18, the pick-and-place machine head 110 moves to the component temporary storage platform 16 to engage a good component 112 meeting a first standard ("good 1"). FIG. 19 shows the next operating sequence in which the head of the pick-and-place machine 110 moves the good1 components 112 to dedicated bin 66 to deposit a good1 component 112 in a good tray 20 therein. The sequences of FIGS. 18 and 19 are repeated until all of the good1 components 112 have been moved to the good tray(s) 20 in the dedicated bin 66.

Figure 20:
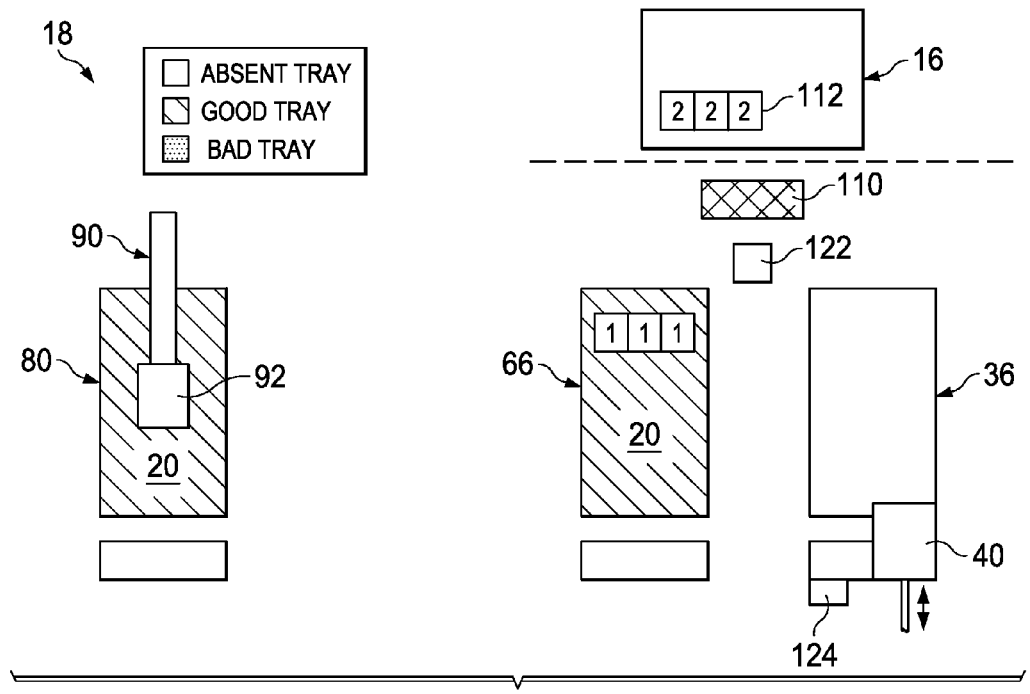

FIG. 20 illustrates the next operating sequence in which the carriage 92 engages a good tray 20 in the empty tray storage bin 80.

Figure 21:
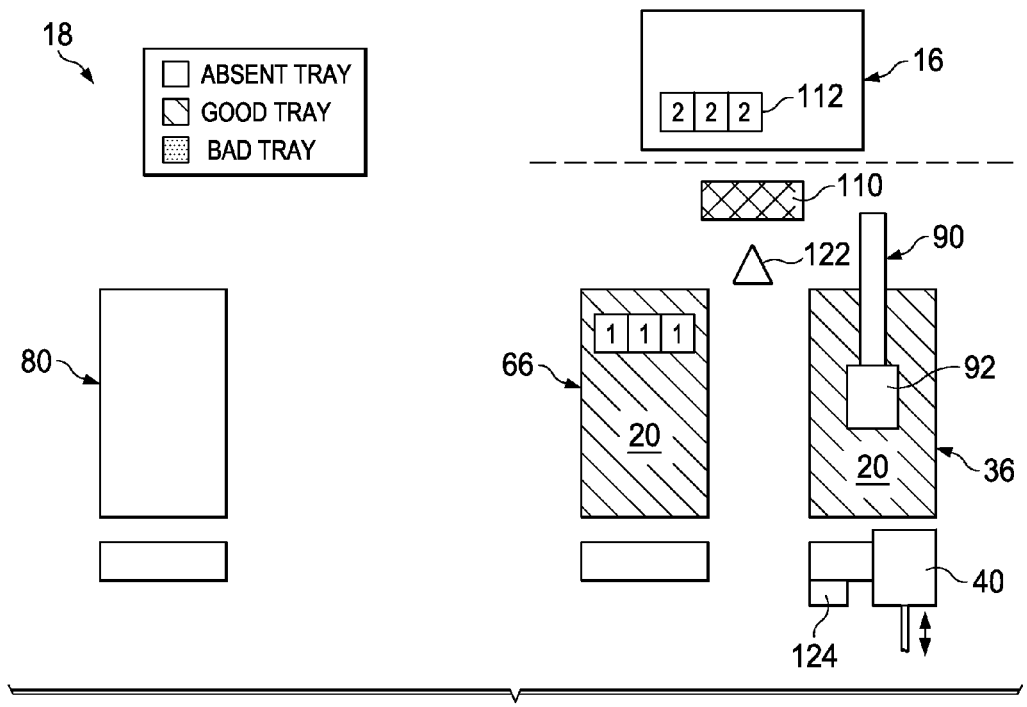
Figure 22:
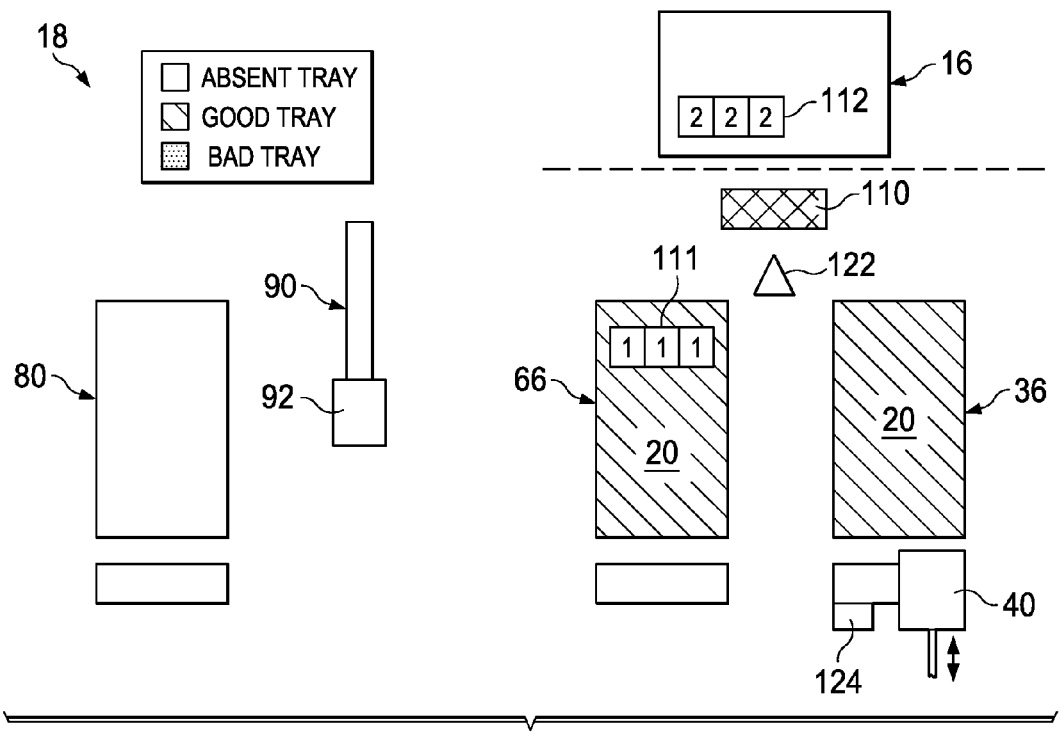

Then, as shown by FIG. 21, the engaged good tray 20 is moved to the configurable tray bin 36. This operation trips a switch 122 (switch 122 corresponds to switch SW1 in the circuit 120) located along the path of tray movement to the configurable tray bin 36. This tripping of SW1 (represented by a triangle in its tripped state) initiates a process in which the bin key 40 is moved from an extended position (associated with the first operating mode) to a retracted position (associated with the second operating mode). With the bin key 40 in this retracted position, the configurable bin 36 is now in the second operating mode and can now operably receive good trays 20. Thus, the tray 20 moved to the tray bin 36 is operably received in the bin 36. Next, as shown in FIG. 22, the carriage 92 returns to its home position.

Figure 23:
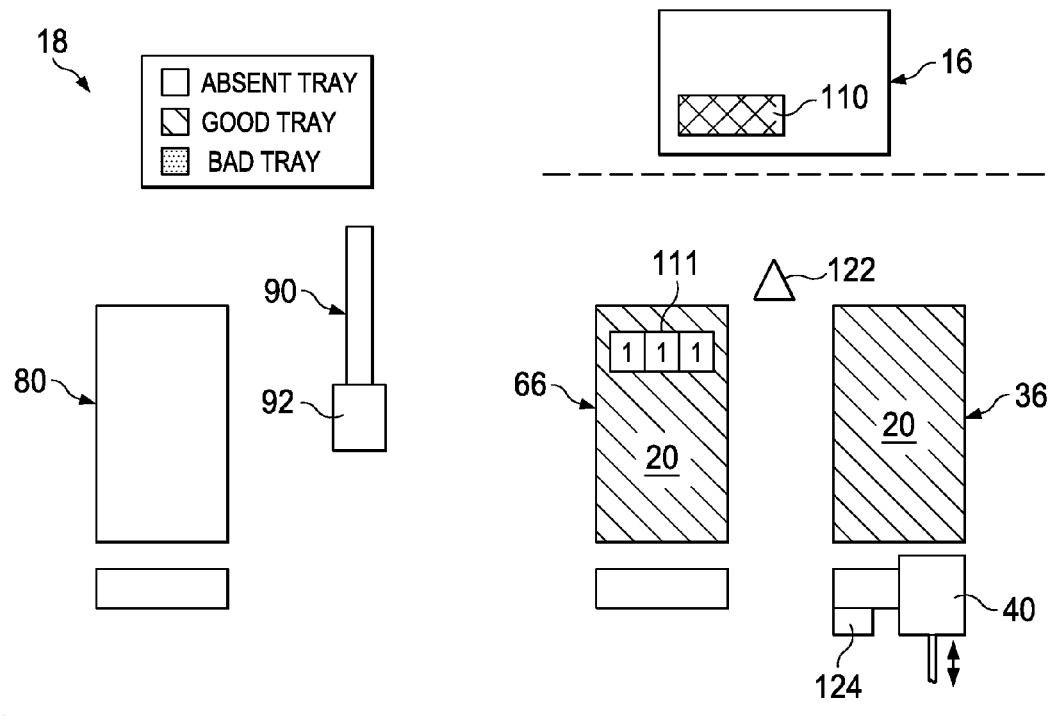
Figure 24:
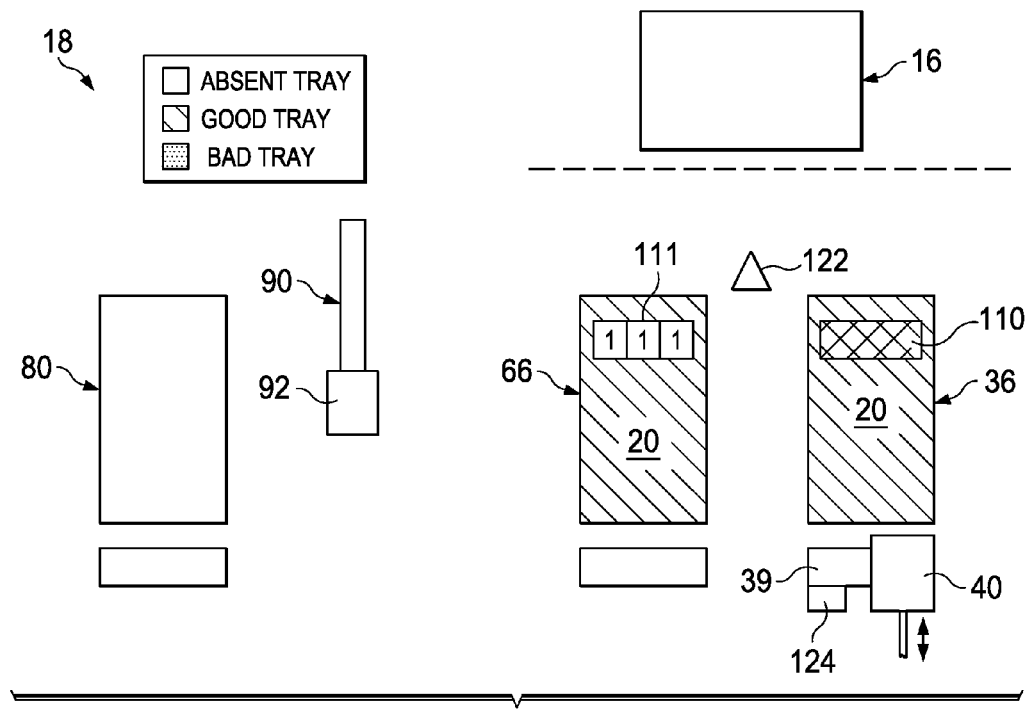

FIG. 23 shows the next operating sequence in which the head of the pick-and-place machine 110 moves to the component temporary storage platform 16 to engage a good component 112 (hidden by head 110) meeting a second standard ("good 2"). Then, as shown in FIG. 24 the head of the pick-and-place machine 110 moves to the configurable tray bin 36 to deposit the good2 component 112 in a good tray 20 therein.

Figure 25:
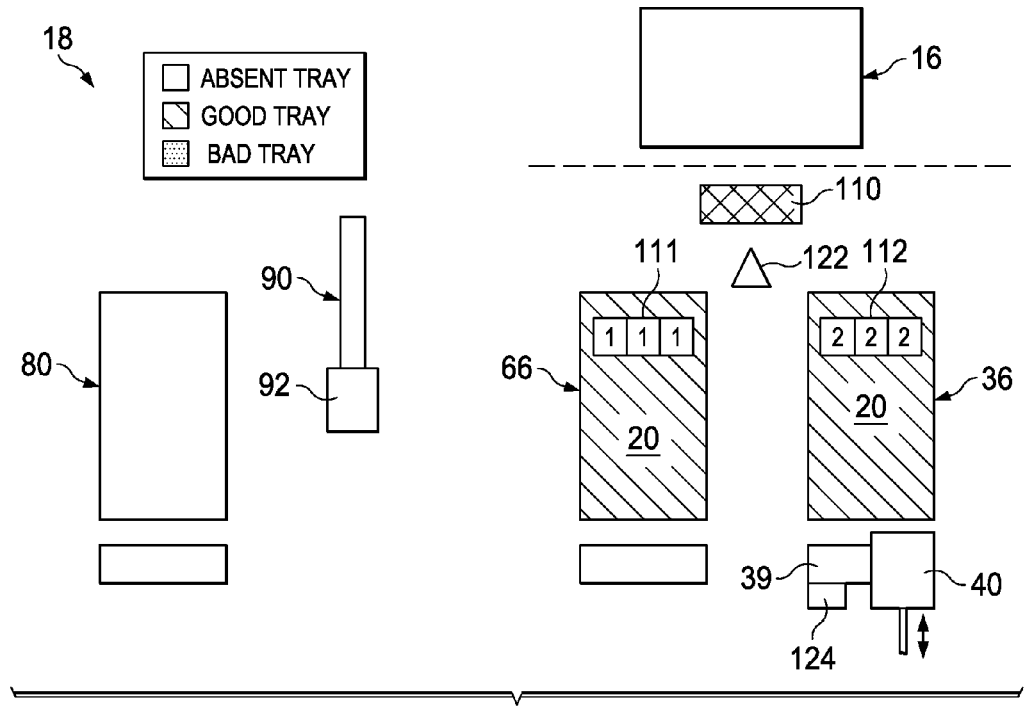

FIG. 25 shows the system 18 after the multiple trays 20 in bin 36 have been fully loaded with good2 components 112 in successive pick and place cycles. In FIG. 25, the pick-and-place head 110 has returned to its home position and the stacked trays 20 are ready to be removed from the bin 36, but the bin door 39 has not yet been opened.

Figure 26:
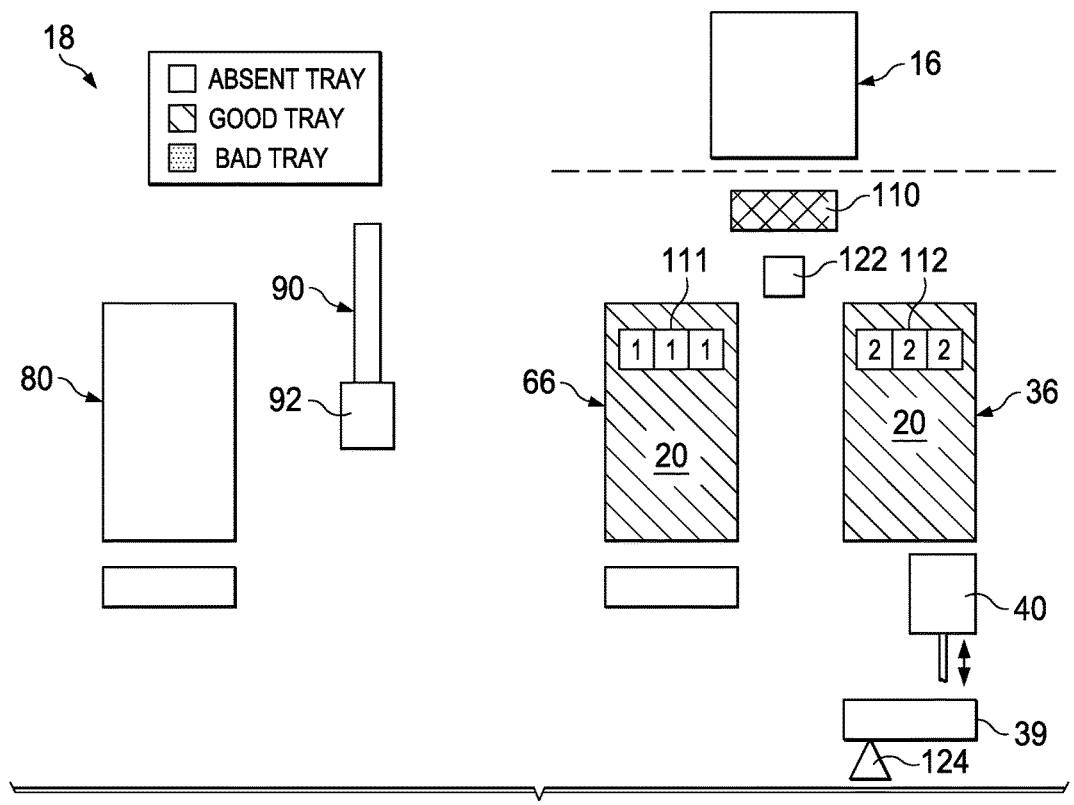

In FIG. 26, the bin door 39 has been opened to remove the stack of good trays 20 from the configurable bin 36. Opening bin door 39 opens bin door switch 124 corresponding to switch SW3 in the circuit 120 of FIG. 28, causing the bin key 40 to extend. However, since the bin key 40 is mounted on the door 39 and the door 39 is open in FIG. 26, the bin key 40 does not make contact with any of the good trays 20 in the configurable bin 36.

Figure 27:
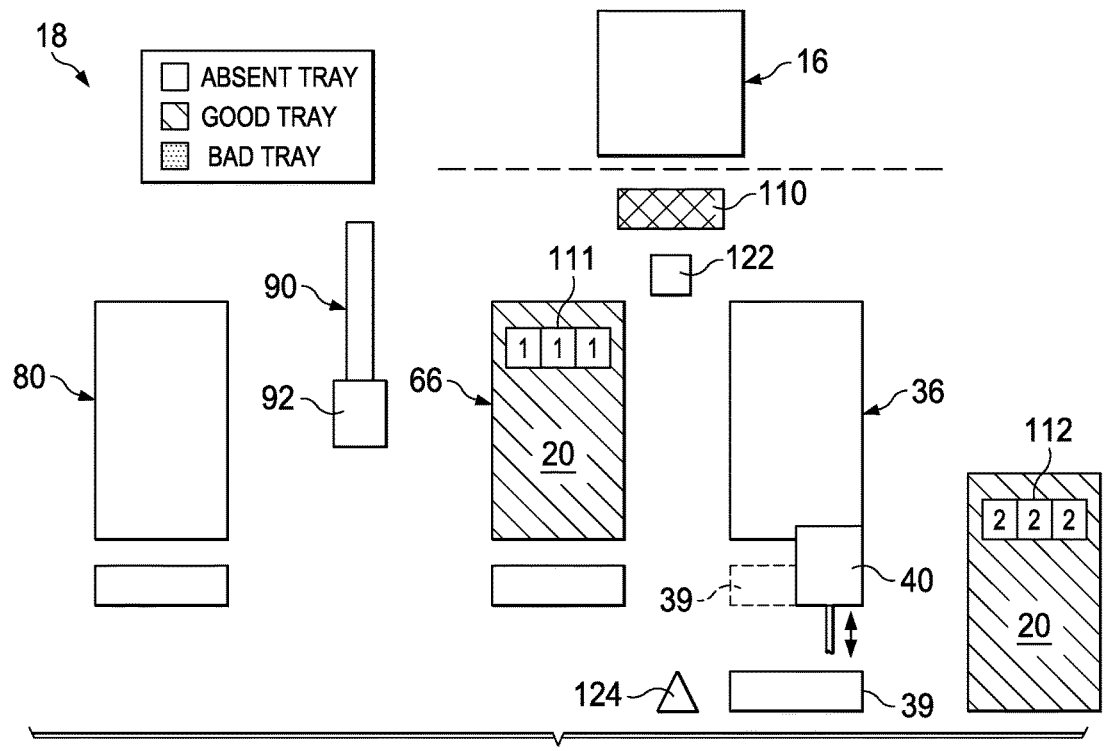

FIG. 27 shows that a stack of loaded good trays 20 has been manually removed from the configurable bin 36. Opening switch 124 has caused the solenoid 130 and the associated bin key 40 to move to the extended position. Thus, operation in the first operating mode of the configurable bin 36 has been initiated and operation in the second operating mode has been terminated. FIG. 27 also shows in dashed lines the further operation of closing the bin door 39. The bin key mounted on door 39 is moved with the closing door and now extends into the bin 36. Now good trays 20 can no longer be operably received in the configurable bin 36.

Closing the bin door 39 also closes the door switch SW3. Although the opening of the door switch SW3 caused the system to switch from the second operating mode to the first operating mode, the closing of the door switch does not, by itself, cause the system to switch back to the second operating mode. Thus, at this point with the bin switch SW3 closed, the bin 36 remains in the first operating mode. To change operating modes, i.e., to initiate operation of the bin 36 in the second operating mode, in addition to closing switch SW3 by closing the bin door 39, another switching operation must be performed. This additional switching operation can be either 1) tripping of switch SW1 with a tray being moved by the automatic tray transfer system 90 or 2) manual tripping of switch SW2 by an operator. When either of these two actions have been completed while the door switch SW3 is closed, the bin key 40 (piston arm 132) is caused to move to its extended position. In the extended position shown in FIG. 27, bin key 40 blocks entry of good trays 20 into the configurable bin 36. The bin 36 is now again in the first operating mode in which bin 36 will no longer operably receive good trays 20 but will operably receive only bad trays 50.

The manner in which the bin key circuit 120 of FIG. 28 operates will now be described in further detail. In the normal, unpowered state of the solenoid 130 the piston arm 132 is extended and the adjustable bin is in the first operating mode. The piston arm 132 is retracted, placing the bin 36 in the second operating mode, when the solenoid 130 receives electric current. The solenoid 130 receives current when relay R1 closes switch SW5. Switches SW4 and SW5 are opened and closed together by relay R1. These switches SW4 and SW5 are closed by relay R1 when R1 is activated (by current flowing through it) and opened when relay R1 is deactivated (when no current flows through it).

The relay R1 is activated when the switch SW3 on the adjustable bin door 39 is closed (by closing the bin door 39) and either: 1) the automatic tray transfer system switch SW1 is closed or 2) the manual tray switch SW2 is closed. When the relay R1 is activated, the switch SW4 closes, which keeps the relay R1 activated until the bin door 39 (switch SW3) is opened.

The device works to place the bin in the second operating mode (good1/good2) by closing either 1) the switch SW1 (by operating the tray transfer system 90) or 2) the switch SW2 (through manual tripping by an operator) after closing the switch SW3 (by closing the unloading door 39 after unloading the adjustable bin 36). The relay R1 then closes switches SW4 and SW5. When switches SW4 and SW5 are closed, the solenoid 130 receives power causing piston arm 132 to retract. With piston 132 retracted good trays 20 can be operably loaded into adjustable bin 36. When switch SW4 is closed, the relay R1 remains active. Therefore, the only way to deactivate the relay R1 and return to the first operating mode is to open the switch SW3, by opening bin door 39.

In summary opening bin door 39 terminates the flow of current to solenoid 130 causing its piston arm 132 to move to and stay in a normally extended position. This is the first operating mode of the adjustable bin 36. Closing the bin door 39 and either: 1) closing the automatic tray transfer system switch SW1, as by engagement of the switch SW1 with a moving tray or 2) closing of the manual tray switch SW2, as by a human operator closing it, causes flow of current to solenoid 130 causing the piston arm 132 to move to the extended position. This is the second operating mode of the configurable bin 36.

With this arrangement, once door 39 has been opened the system 18 goes into the first operating mode and will not receive good trays into bin 36. The system 18 may be placed in the second operating mode only by: 1) moving a good tray with the tray transfer system 90 into the bin 36, (closing switch SW1) while the bin door switch SW3 is closed or 2) by an operator's closing the switch SW2 while the bin door 39 (switch SW3) is closed. This will prevent bad parts from being loaded into a good tray 20 that is mistakenly placed in bin 36. The reason for this result is that there will never be a good tray 20 operatively received in bin 36, after the stack of good trays have been unloaded from it, without two affirmative switching actions being taken to change the position of the bin key 40/solenoid piston 132.

Figure 29:
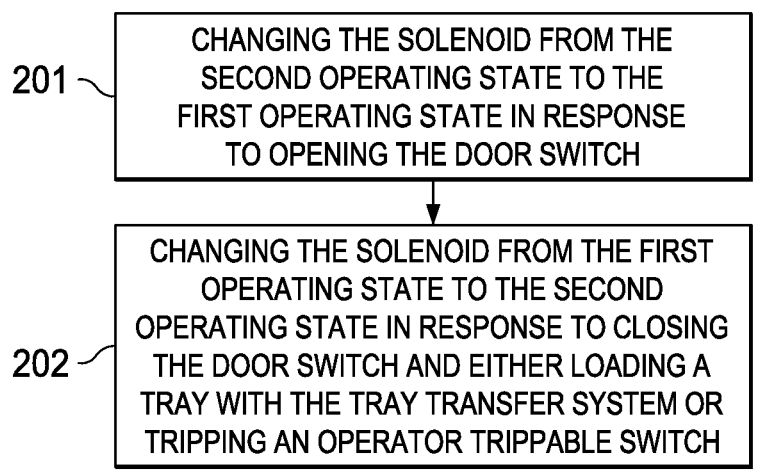
FIG. 29 is a flow chart of a method of using a switching assembly

It will be appreciated from the above disclosure that a method of using a switching assembly has been disclosed as shown in FIG. 29. The switching assembly includes a voltage source and a ground; a door switch associated with a tray exit door; an automatic tray transfer system switch connected in series with the door switch and adapted to change switch states when the automatic tray transfer system goes from a tray loading state to an idle state. The switch assembly also includes an operator trippable switch connected in parallel with the automatic tray transfer system switch; a relay located between the voltage source and the automatic tray transfer system switch; a first relay actuated switch connected in parallel with the automatic tray transfer system switch and the operator trippable switch. The assembly further includes a second relay actuated switch connected in series with the automatic tray transfer system switch, the operator trippable switch and the first relay actuated switch. The assembly also includes a solenoid having a first operating state and a second operating state connected that is connected in series with the second relay actuated switch and the ground. The method includes, as shown at block 201, changing the solenoid from the second operating state to the first operating state in response to opening the door switch. The method also includes, as shown at block 202 changing the solenoid from the first operating state to the second operating state in response to closing the door switch and either loading a tray with the tray transfer system or tripping an operator trippable switch.

Certain specific embodiments of a tray loading system for tested electronic components and related methods have been described in detail herein. Alternative embodiments of tray loading systems and related methods will be obvious to those skilled in the art after reading this disclosure. It is intended that the appended claims be broadly construed to cover all alternative embodiments of the tray loading systems and related methods whether such alternative embodiments are expressly described herein or not, except as limited by the prior art.

What is claimed is:

1. A tray loading system, comprising:
   a first tray having a first configuration and a first cutout portion;
   a second tray having a second configuration and a second cutout portion;
   a tray loading bin, including an entrance end configured to receive the first tray or the second tray, and an exit end having an engagement surface and a bin key conduit;
   a bin key movable along the bin key conduit, the bin key shaped to fit with the first cutout portion and mismatch from the second cutout portion, the bin key extendable beyond the engagement surface to prevent the second tray from engaging the engagement surface, and the bin key retractable from the engagement surface to allow the second tray to engage the engagement surface; and
   a sensor configured to detect whether the engagement surface is engaged or disengaged, and generate a operation signal when the engagement surface is engaged, and a termination signal when the engagement surface is disengaged.

2. The tray loading system of claim 1 wherein:
   the bin key includes a circuit having a displaceable mechanical member;
   the circuit configured to generate a first operating mode signal when the displaceable mechanical member is in a first position associated with the bin key extending beyond the engagement surface; and
   the circuit configured to generate a second operating mode signal when the displaceable mechanical member is in a second position associated with the bin key retracting from the engagement surface.

3. The tray loading system of claim 2, wherein the displaceable mechanical member includes.

4. The tray loading system of claim 2, wherein the tray loading bin is configured to a first operating mode upon receiving the first operating mode signal.

5. The tray loading system of claim 4, wherein the first operation mode is associated with the first configuration of the first tray.

6. The tray loading system of claim 2, wherein the tray loading bin is configured to a second operating mode upon receiving the second operating mode signal.

7. The tray loading system of claim 6, wherein the second operation mode is associated with the second configuration of the second tray.

8. The tray loading system of claim 1, wherein the tray loading bin includes a loading bin exit door configured to close upon receiving the operation signal from the sensor.

* * * * *